(12) United States Patent
Ishimoto

(10) Patent No.: US 8,849,442 B2
(45) Date of Patent: Sep. 30, 2014

(54) COMPONENT MOUNTING LINE AND COMPONENT MOUNTING METHOD

(75) Inventor: Kenichirou Ishimoto, Yamanashi (JP)

(73) Assignee: Panasonic Corporation, Osaka (JP)

( * ) Notice: Subject to any disclaimer, the term of this patent is extended or adjusted under 35 U.S.C. 154(b) by 546 days.

(21) Appl. No.: 13/145,969

(22) PCT Filed: Jan. 19, 2010

(86) PCT No.: PCT/JP2010/000274
§ 371 (c)(1),
(2), (4) Date: Sep. 21, 2011

(87) PCT Pub. No.: WO2010/084735
PCT Pub. Date: Jul. 29, 2010

(65) Prior Publication Data
US 2012/0004759 A1     Jan. 5, 2012

(30) Foreign Application Priority Data

Jan. 23, 2009 (JP) ................................ P2009-012620

(51) Int. Cl.
*G06F 19/00*     (2011.01)
*H05K 13/08*     (2006.01)

(52) U.S. Cl.
CPC ..................................... *H05K 13/08* (2013.01)
USPC ............................................ 700/121; 29/832

(58) Field of Classification Search
CPC .................. G05B 19/14865; G05B 22/91313; G05B 19/141865; B25J 9/1687
USPC ..................... 700/121, 100, 108; 29/832, 836; 382/145, 147

See application file for complete search history.

(56) References Cited

U.S. PATENT DOCUMENTS 5,846,852 A * 12/1998 Limper-Brenner et al. .. 438/118
6,249,598 B1    6/2001 Honda et al.
(Continued)

FOREIGN PATENT DOCUMENTS

JP    05-128122 A    5/1993
JP    07-326900 A    12/1995
(Continued)

OTHER PUBLICATIONS

International Search Report for PCT/JP2010-000274 dated Feb. 16, 2010.

*Primary Examiner* — Kidest Bahta
(74) *Attorney, Agent, or Firm* — Pearne & Gordon LLP

(57) ABSTRACT

Disclosed are a component mounting line and a component mounting method where it is not necessary for an operator to perform an input operation in an inspection device when substitute components are used in a component mounting device. When substitute components are mounted in place of one type of components at the mounting positions on the substrate PB, a component mounting device 4 creates substitute component related data including information specifying the substrate PB on which substitute components are mounted and the mounting positions at which the substitute components on the substrate PB are mounted and information indicating the types of substitute components and transmits the substitute component related data to the post-mounting inspection device. The post-mounting inspection device 5 specifies the substrate PB on which the substitute components are mounted and the mounting positions at which the substitute components on the substrate PB are mounted on the basis of the substitute components related data received from the component mounting device 4 and changes image data 45 (inspection data) for the components P at the mounting positions at which the substitute components are mounted to data corresponding to the types of the substitute components.

5 Claims, 8 Drawing Sheets

(56) References Cited

U.S. PATENT DOCUMENTS

| | | | |
|---|---|---|---|
| 6,286,202 B1* | 9/2001 | Asai et al. | 29/740 |
| 6,643,921 B2* | 11/2003 | Asai et al. | 29/740 |
| 6,941,646 B2* | 9/2005 | Suhara | 29/740 |
| 7,310,460 B2* | 12/2007 | Ide et al. | 385/16 |
| 8,271,125 B2* | 9/2012 | Kretsis | 700/214 |
| 2002/0184755 A1* | 12/2002 | Suhara | 29/833 |
| 2003/0098798 A1* | 5/2003 | Kato | 340/679 |
| 2005/0190956 A1* | 9/2005 | Fujii et al. | 382/141 |
| 2005/0209882 A1* | 9/2005 | Jacobsen et al. | 705/2 |
| 2006/0136786 A1* | 6/2006 | Nonaka et al. | 714/39 |
| 2010/0189340 A1* | 7/2010 | Ueda | 382/145 |

FOREIGN PATENT DOCUMENTS

| | | |
|---|---|---|
| JP | 10-141929 A | 5/1998 |
| JP | 2002-299900 A | 10/2002 |

* cited by examiner

COMPONENT MOUNTING LINE AND COMPONENT MOUNTING METHOD

TECHNICAL FIELD

The present invention relates to a component mounting line which includes a component mounting device and an inspection device which performs appearance visual inspection for a substrate with components mounted by the component mounting device, and to a component mounting method.

BACKGROUND ART

A component mounting line includes a solder printer which performs solder printing on a substrate, a component mounting device which mounts components on the substrate after solder printing, a reflow furnace which heats and cools the substrate with the components mounted by the component mounting device to perform solder reflow, and a plurality of inspection devices which visually recognize the appearance of the substrate after each process of solder printing, component mounting, and solder reflow and perform inspection (appearance visual inspection) of the substrate after each process ends.

The component mounting device reads data from an NC program stored in a storage unit regarding what types of components are mounted, the positions where components are mounted on the substrate, and the sequence how components are mounted, and also reads component parameters indicating the shape of respective components and the like from a component library to mount predetermined components at defined mounting positions.

Among the above-described inspection devices, an inspection device which performs the inspection of the substrate after components are mounted reads data from component mounting data stored in the storage unit regarding what types of components are mounted by the component mounting device, the positions where components are mounted on the substrate, and the sequence how components are mounted, also reads image data (master image data for pattern matching) from an image data library corresponding to the types of the respective components, and compares actual images of the visually recognized components with image data corresponding to the types of the components to determine the presence or absence of components where the mounting is defective.

When the components have run out in the component mounting line due to deficiency of components which should be supplied to the components mounting device, substitute components which are another type of components having the same electrical characteristics and a different appearance may be used (see Patent Document 1). When the substitute components are used in the component mounting device, an operator performs an input to rewrite the names of the types of components which have run out to the names of the types of substitute components in the component mounting device such that the component mounting device can read component parameters corresponding to the substitute components and an input of a change in the data (image data) for inspecting the components at the mounting positions where the substitute components are mounted to image data corresponding to the types of the substitute components is performed even in the inspection device so as to prevent the occurrence of inspection errors in the inspection device.

CITATION LIST

Patent Literature

[Patent Document 1] JP-A-2002-299900

SUMMARY OF INVENTION

Technical Problem

However, it is troublesome for the operator to perform an input operation in the inspection device so every time the substitute components are used in the component mounting device as described above, and it is necessary for the operator to carefully perform the operation so as not to make any input mistakes, thereby causing a problem in that working efficiency is degraded.

Accordingly, an object of the invention is to provide a component mounting line and a component mounting method where it is not necessary for an operator to perform an input operation in an inspection device when substitute components are used in a component mounting device.

Solution to Problem

A component mounting line of the invention includes a component mounting device which mounts components on a substrate and an inspection device which performs appearance visual inspection for a substrate with components mounted by the component mounting device. The component mounting device includes a data creation unit for, when the substitute components which are another type of components having the same electrical characteristics and a different appearance are mounted in place of one type of components at the mounting positions on the substrate, creating substitute component related data including information specifying the substrate on which the substitute components are mounted and the mounting positions at which the substitute components on the substrate are mounted and information indicating the types of substitute components, and a data transmission unit for transmitting the substitute component related data created by the data creation unit to the inspection device. The inspection device includes a data receiving unit for receiving the substitute component related data transmitted from the component mounting device, and a data change unit for specifying the substrate on which the substitute components are mounted and the mounting positions at which the substitute components on the substrate are mounted on the basis of the substitute components related data received by the data receiving unit and changing data for inspecting the components at the mounting positions at which the substitute components are mounted to image data corresponding to the types of the substitute components.

In the above-described configuration, each of the data creation unit and the data change unit may include a code reading unit for reading an individual identification code provided on the substrate. The data creation unit may specify the substrate on which the substitute components are mounted on the basis of the individual identification code of the substrate read by the code reading unit, and the data change unit may specify the substrate on which the substitute components are mounted on the basis of the individual identification code of the substrate read by the code reading unit.

The invention provides a component mounting method using a component mounting line. The component mounting line includes a component mounting device which mounts components on a substrate, and an inspection device which performs appearance visual inspection for the substrate with components mounted by the component mounting device. The component mounting method includes the steps of, when substitute components which are another type of components having the same electrical characteristics and a different appearance are mounted in place of one type of components at the mounting positions on the substrate, causing the component mounting device to create substitute component related data including information specifying the substrate on which substitute components are mounted and the mounting positions at which the substitute components on the substrate are mounted and information indicating the types of substitute components and to transmit the substitute component related data to the inspection device, and causing the inspection device to specify the substrate on which the substitute components are mounted and the mounting positions at which the substitute components on the substrate are mounted on the basis of the substitute components related data received from the component mounting device and to change data for inspecting the components at the mounting positions at which the substitute components are mounted to data corresponding to the types of the substitute components.

Advantageous Effects of Invention

According to the invention, when the substitute components are mounted in place of one type of components at the mounting positions on the substrate, the component mounting device creates the substitute component related data including the information specifying the substrate on which the substitute components are mounted and the mounting positions at which the substitute components on the substrate are mounted and information indicating the types of substitute components, and transmits the substitute component related data to the inspection device. The inspection device specifies the substrate on which the substitute components are mounted and the mounting positions at which the substitute components on the substrate are mounted, and changes the data for inspecting the components at the mounting positions at which the substitute components are mounted to image data corresponding to the types of substitute components on the basis of the received substitute component related data. Even when the substitute components are used in the component mounting device, it is possible to improve the working efficiency as it is not necessary for the operator to perform an input operation in the inspection device.

DESCRIPTION OF EMBODIMENTS

Figure 1:
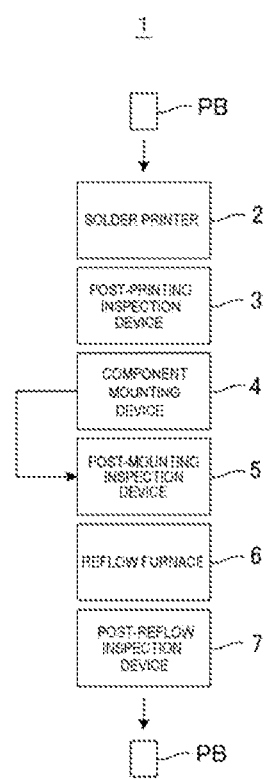
FIG. 1 is a schematic configuration diagram of a component mounting line according to an exemplary embodiment of the invention.
Figure 2:
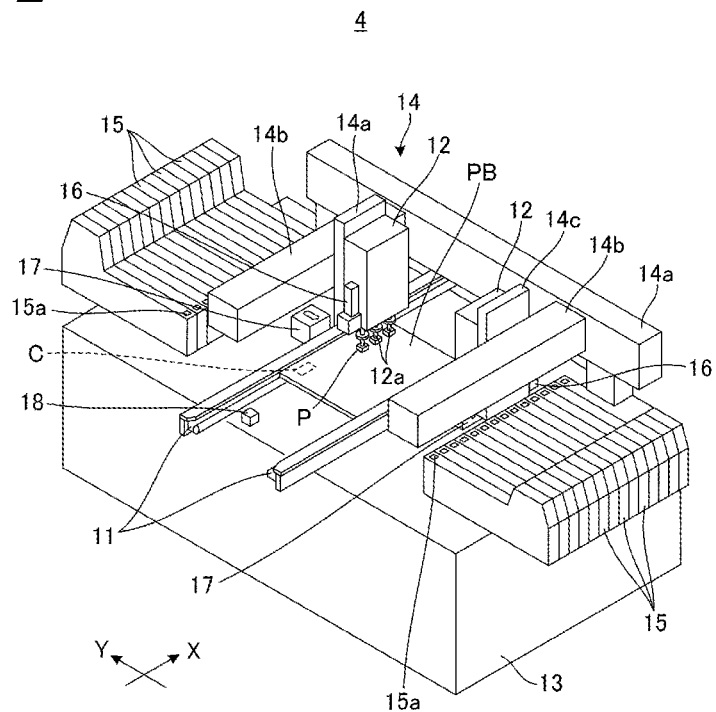
FIG. 2 is a perspective view of a component mounting device configuring the component mounting line according to the exemplary embodiment of the invention.
Figure 3:
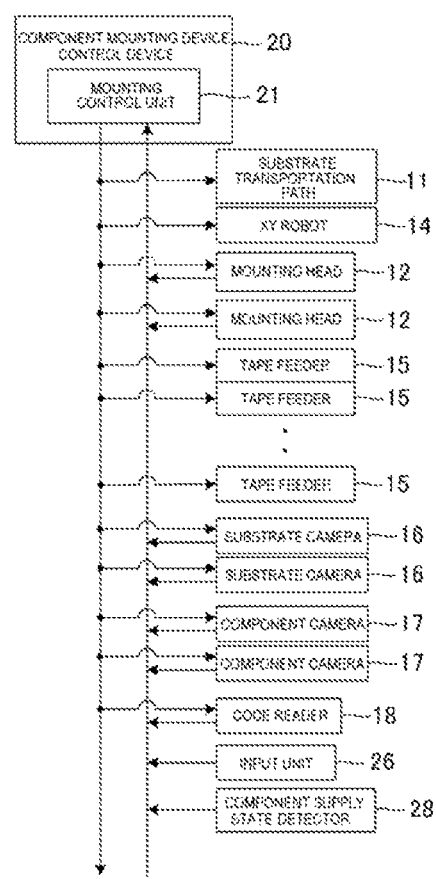
FIG. 3 is a block diagram showing a control system of the component mounting device according to the exemplary embodiment of the invention.
Figure 4:
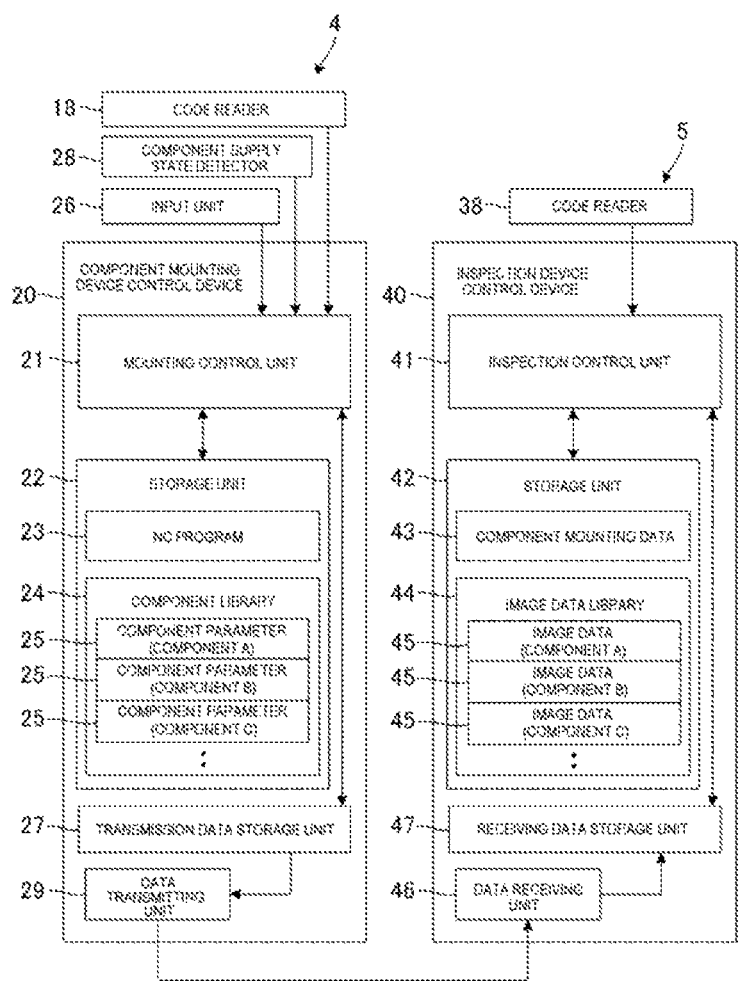
FIG. 4 is a block diagram showing a configuration of data transmission from the component mounting device and a post-mounting inspection device according to the exemplary embodiment of the invention.
Figure 5:
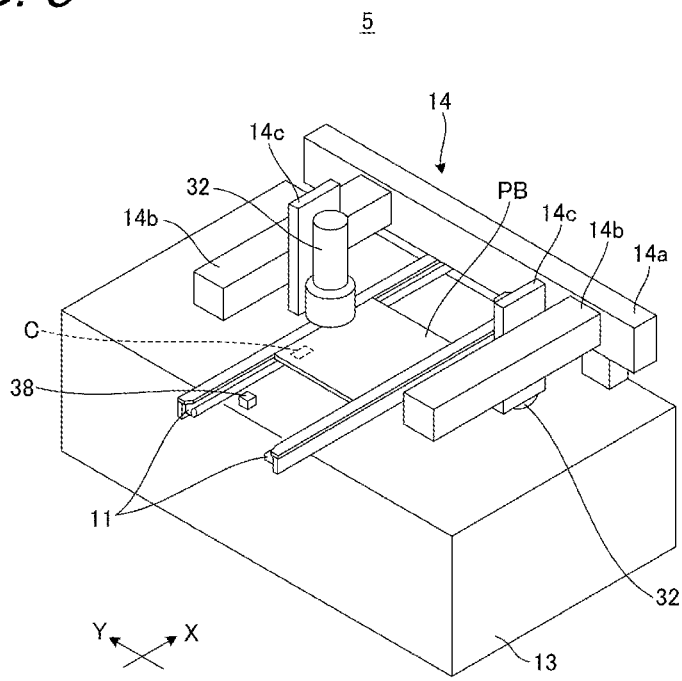
FIG. 5 is a perspective view of the post-mounting inspection device configuring the component mounting line according to the exemplary embodiment of the invention.
Figure 6:
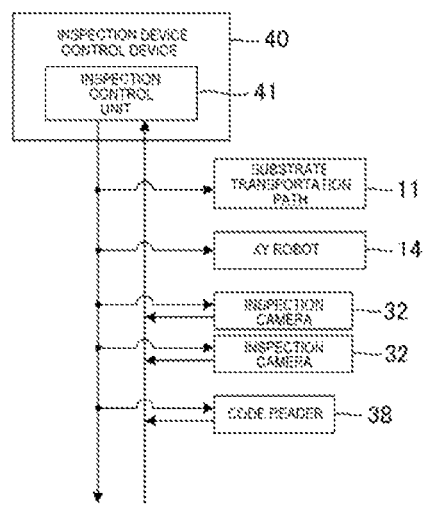
FIG. 6 is a block diagram showing the control system of the post-mounting inspection device according to the exemplary embodiment of the invention.
Figure 7:
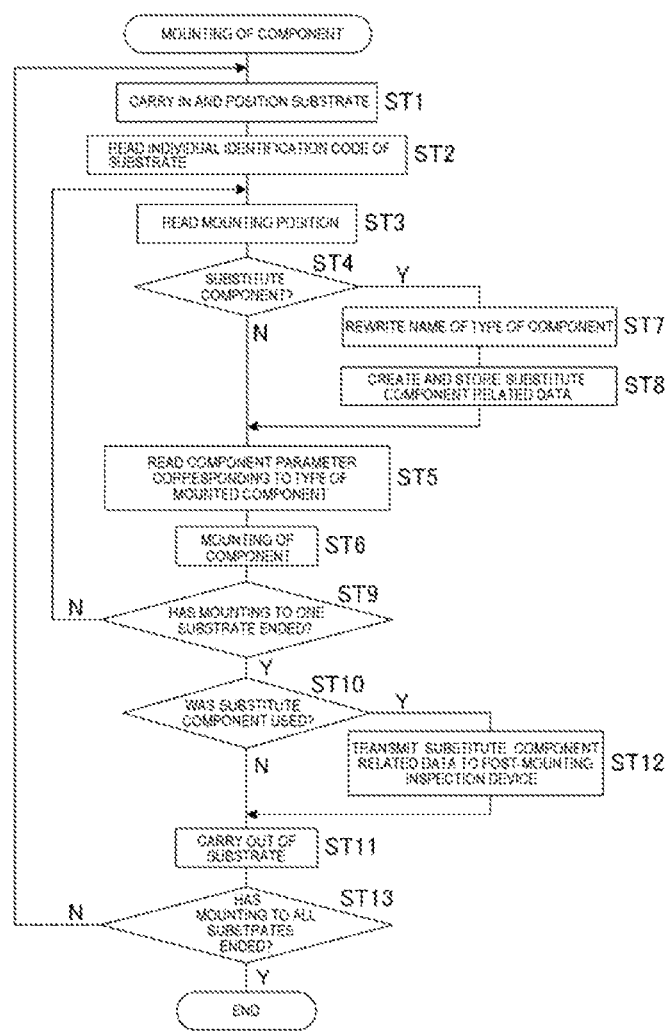
FIG. 7 is a flow chart showing a sequence of a component mounting process performed by the component mounting device according to the exemplary embodiment of the invention.
Figure 8:
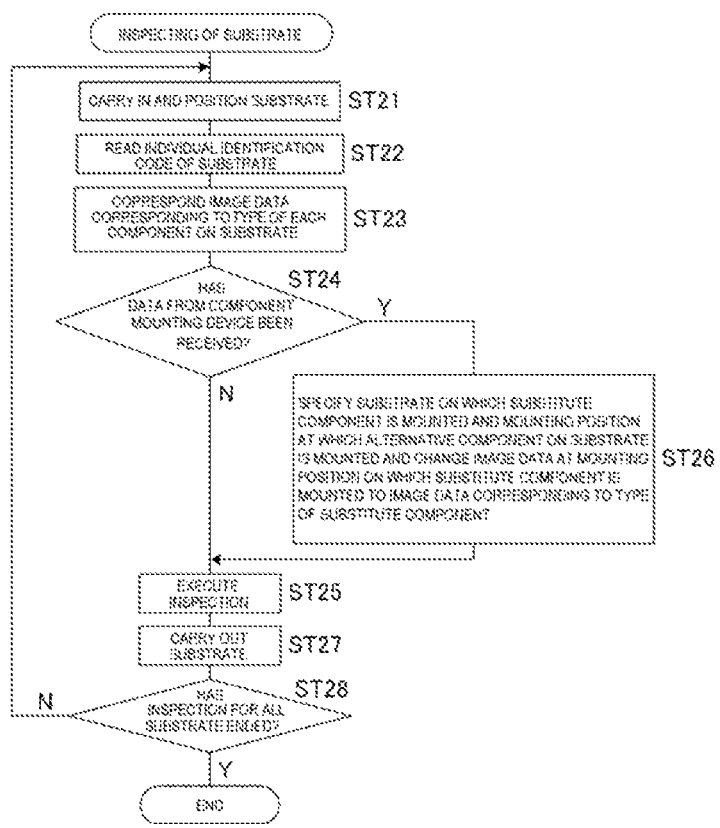
FIG. 8 is a flow chart showing a sequence of a substrate inspection process performed by the post-mounting inspection device according to the exemplary embodiment of the invention.

Hereinafter, an exemplary embodiment of the invention will be described with reference to the accompanying drawings. FIG. 1 is a schematic configuration diagram of a component mounting line according to an exemplary embodiment of the invention, FIG. 2 is a perspective view of a component mounting device configuring the component mounting line according to the exemplary embodiment of the invention, FIG. 3 is a block diagram showing a control system of the component mounting device according to the exemplary embodiment of the invention, FIG. 4 is a block diagram showing a configuration of data transmission from the component mounting device and a post-mounting inspection device according to the exemplary embodiment of the invention, FIG. 5 is a perspective view of the post-mounting inspection device configuring the component mounting line according to the exemplary embodiment of the invention, FIG. 6 is a block diagram showing the control system of the post-mounting inspection device according to the exemplary embodiment of the invention, FIG. 7 is a flow chart showing a sequence of a component mounting process performed by the component mounting device according to the exemplary embodiment of the invention, and FIG. 8 is a flow chart showing a sequence of a substrate inspection process performed by the post-mounting inspection device according to the exemplary embodiment of the invention.

In FIG. 1, a component mounting line 1 is configured by connecting a plurality of working devices that includes a solder printer 2, a post-printing inspection device 3, a component mounting device 4, a post-mounting inspection device 5, a reflow furnace 6, and a post-reflow inspection device 7.

The solder printer 2 performs screen printing work that prints a solder in a paste type on an electrode (not shown) on a substrate PB after positioning the substrate PB which is carried in from an upstream side at a predetermined position. The solder printer 2 carries the substrate PB out to the post-printing inspection device 3 at a downstream side when the screen printing work has been performed.

The post-printing inspection device 3 visually recognizes an appearance of the substrate PB by imaging the substrate PB using an inspection camera (not shown) after positioning the substrate PB which is carried in from the solder printer 2 at a predetermined position and performs the inspection (appearance visual inspection) on whether there is a defective location in the solder printing. The post-printing inspection device 3 carries the substrate PB out to the component mounting device 4 at the downstream side when the appearance visual inspection for the substrate PB has ended.

The component mounting device 4 performs the component mounting work of mounting the components P at the predetermined position on the substrate PB after positioning the substrate PB carried in from the post-printing inspection device 3 at a predetermined position. The component mounting device 4 carries the substrate PB out to the post-mounting inspection device 5 at the downstream side when the component mounting work for the substrate PB has ended. The configuration of the component mounting device 4 will be described in more detail below.

The post-mounting inspection device 5 performs the inspection (appearance visual inspection) on whether or not the mounting of components P is erroneous by visualizing the appearance of the substrate PB after positioning the substrate PB which is carried in from the component mounting device 4 at the predetermined position. The post-mounting inspection device 5 carries the substrate PB out to the reflow furnace 6 at the downstream side when the appearance visual inspection for the substrate PB has ended. The configuration of the post-mounting inspection device 5 will be described in more detail below.

The reflow furnace 6 accepts the substrate PB carried out from the post-mounting inspection device 5 and performs the solder reflow working while transporting the substrate PB so as to proceed to the furnace. When the substrate PB is heated and cooled in the furnace, the solder on the substrate PB is solidified, such that the components P are fixed on the substrate PB. The substrate PB passing through the furnace is carried out to the post-reflow inspection device 7 at the downstream side as it is.

The post-reflow inspection device 7 visually recognizes the appearance of the substrate PB by imaging the substrate PB using the inspection camera (not shown) after positioning the substrate PB which is carried in from the reflow furnace 6 at a predetermined position and performs the inspection (appearance visual inspection) on whether or not there is a defective solder location in the substrate PB. The post-reflow inspection device 7 carries the substrate PB out to the component mounting line using a substrate transportation path when the appearance visual inspection for the substrate PB has ended.

Next, the component mounting device 4 will be described. In FIG. 2, the component mounting device 4 includes a substrate transportation path 11 configured of a pair of conveyor belts and two mounting head 12 that performs the mounting of components (electronic components) P on the substrate which is carried in and positioned using the substrate transportation path 11.

In FIG. 2, an XY robot 14 is configured to include Y-axis table 14a extending to a horizontal direction (Y-axis direction) orthogonal to a transportation direction (X-axis direction) of the substrate PB using the substrate transportation path 11, two X-axis tables 14b extending in the X-axis direction and slidable in the Y-axis direction on the Y-axis table 14a, and two head support parts 14c slidable in the X-axis direction on the X-axis table 14b. The XY robot 14 is installed on a base frame 13 and each head support part 14c is attached to the mounting head 12 one by one.

The base frame 13 is detachably attached with a plurality of tape feeders 15 and each of the tape feeders 15 supplies the components P to predetermined component supply positions 15a. Each mounting head 12 is attached with a plurality of adsorption nozzles 12a that perform adsorption (pick up) and separation of the components P using a vacuum pressure control.

In FIG. 2, each mounting head 12 is attached with a substrate camera 16 of which the imaging field of view faces downward and both outer positions of two substrate transportation paths 11 on the base frame 13 are attached one by one with the component camera 17 which have the imaging field of view which faces upward. The substrate camera 16 moves in a horizontal in-plane direction together with the mounting head 12 and images a substrate position detection mark (not shown) of a top surface of the substrate PB positioned using the substrate transportation path 11 from above. The component camera 17 images the components P which the mounting head 12 picks up from the tape feeder 15 from below.

In FIG. 2, the carried-in side of the substrate PB of the substrate transportation path 11 is mounted with a code reader 18 that reads an individual identification code C (substrate ID) provided on a bottom surface of the substrate PB.

In FIG. 3, an operation of transporting and positioning the substrate PB using the substrate transportation path 11, the moving operation of each mounting head 12 using the XY robot 14, the supply operation of the components P using each tape feeder 15, and the adsorption and separation operation of the components P using each mounting head 12 (adsorption nozzle 12a) are performed using a mounting control unit 21 of a control device (component mounting device control device 20) included in the component mounting device 4 and image data captured by the imaging operations of each substrate camera 16 and each component camera 17 are each transmitted to the mounting control unit 21. Further, the operation control of the code reader 18 is performed using the mounting control unit 21 and the information on the individual identification code C of the substrate PB read by the code reader 18 is transmitted to the mounting control unit 21.

In FIG. 4, a storage unit 22 of the component mounting device control device 20 stores an NC program and a component library 24. The NC program 23 defines the operation of the component mounting device 4 during the component mounting process and defines which type of components are mounted at which positions and in what order on the substrate, or the like. The component library 24 is an organization of data that component parameters 25 such as shapes corresponding to a type of each component P used in the component mounting process.

During the component mounting process, the mounting control unit 21 operates each part of the component mounting device 4 in accordance with the NC program 23 after transporting and positioning the substrate PB using the substrate transportation path 11 and sequentially mounts predetermined types of the components P at the defined positions (mounting position) on the substrate PB. In this case, the mounting control unit 21 reads the component parameters 25 corresponding to the type of each component P from the component library 24 and is used to control the adsorption nozzle 12a, or the like, from the adsorption of the components P to the separation on the substrate PB.

Since the component mounting device 4 is operated to mount the components P of the type defined in the NC program 23 at the mounting positions defined in the NC program 23, the operator needs to set the tape feeder 15 so that the components P of the type defined in the NC program 23 are supplied but may use another type of the components P (substitute components) that has the same electrical characteristics and a different appearance when the components have run out due to deficiency of components P to be supplied by the progress of the components mounting process. For example, when "component a" defined in the NC program 23 is lacking, "component b" having the same electrical characteristics as "component a" is used as a substitute component of "component a".

When "component b" is used as a substitute component of "component a" as described above, the operator performs an input of contents that 'in regards to the tape feeder supplying "component a", when the head portion of the tape is detected, "component a" of the NC program 23 is rewritten as "component"' by performing a predetermined operation from an input unit 26 (FIGS. 3 and 4) installed in the component mounting device 4, while replacing (or perform tape splicing) the tape of the tape feeder 15 supplying "component a" until switched to the tape supplying "component b".

The mounting control unit 21 receiving the above-described input from the input unit 26 creates the substitute component related data including each information such as "information specifying the substrate on which the substitute components are mounted and the mounting positions at which the substitute components on the substrate are mounted" and "information that indicates the type of the substitute components", in detail, "the individual identification code of the substrate on which the substitute components are mounted", "the mounting positions of the substitute components on the substrate" and "the name of the type of the substitute components" and stores the created substitute component related data in a transmission data storage unit 27 (FIG. 4) installed in the component mounting device control device 20, while rewriting the name of the type of the components P in the NC program 23 from "component a" to "component b" when the head part of the tape (the tape supplying the substitute components) is detected, in the tape feeder 15 which had previously supplied "component a".

In this case, as the "information specifying the substrate on which the substitute components are mounted and the mounting positions at which the substitute components on the substrate are mounted", the following may be used; the information on all the mounting positions mounted with the substitute components individually shown on the substrate PB on which the substitute components are mounted and the information indicating the mounting positions first mounted with the substitute components and indicating that all the subsequently mounted components are the substitute components.

In this case, the mounting control unit 21 uses a component supply state detector 28 that uses the individual identification code C read by the code reader 18 so as to specify "the substrate PB on which the substitute components are mounted", is installed in each tape feeder 15 so as to detect the head part of the tape in each tape feeder 15, and detects the position of the head part of the tape set in the tape feeder 15 and the position of the connection tape (the tape connecting ends of two tapes performing the slicing) for tape slicing.

That is, in the exemplary embodiment of the invention, the mounting control unit 21, the input unit 26, the code reader 18, and the component supply state detector 28 serve as a "data creation unit" creating the substitute component related data including "information specifying the substrate on which the substitute components are mounted and the mounting positions at which the substitute components on the substrate are mounted" and "information that indicates the type of the substitute components" when the supplied component P is replaced by the substitute components.

The mounting control unit 21 transmits the substitute component related data stored in the transmission data storage unit 27 from the data transmitting unit 29 (FIG. 4) installed in the component mounting device 4 to the post-mounting inspection device 5 when the component mounting process for one substrate PB ends and the substrate PB is carried out to the post-mounting inspection device 5 at the downstream side.

Next, the post-mounting inspection device 5 will be described. In FIG. 5, the post-mounting inspection device 5 includes the base frame 13, the substrate transportation path 11, and the XY robot 14, similar to the configuration of the component mounting device 4, wherein each head support part 14c is attached with the inspection camera 32 which has the imaging field of view which faces downward. Further, the carried-in side of the substrate PB of the substrate transportation path 11 is installed with the code reader 38, similar to the component mounting device 4.

In FIG. 6, an operation of transporting and positioning the substrate PB using the substrate transportation path 11 and the moving operation of each inspection camera 32 using the XY robot 14 are performed by an inspection control unit 41 of the control device (inspection device control device 40) included in the post-mounting inspection device 5 and the image data captured by the imaging operation of each inspection camera 32 are transmitted to the inspection control unit 41. Further, the operation control of the code reader 38 is performed using the inspection control unit 41 and the information on the individual identification code C of the substrate PB read by the code reader 38 is transmitted to the inspection control unit 41.

In FIG. 4, the storage unit 42 of the inspection device control device 40 stores a component mounting data 43 and a data library 44. The component mounting data 43 defines the operation of the post-mounting inspection device 5 during the substrate inspection process and defines which position on the substrate PB is mounted with which type of the components P while defining whether the appearance of the substrate PB is visually recognized in what order for the positioned substrate PB. The image data library 44 is data where the image data 45 (master image data for pattern matching) corresponding to the type of each component P are organized.

During the substrate inspection process, the inspection control unit 41 operates each part of the post-mounting inspection device 5 according to the component mounting data 43 and visually recognizes the local appearance of the substrate PB (the substrate PB on which the component mounting is made by the component mounting device 4) positioned using the substrate transportation path 11 in a predetermined order. At the time of the visualization, it is determined whether the mounting state on the substrate PB of each component P is good by reading the image data 45 corresponding to the type of each component P that is an inspection object in the field of view of the inspection camera 32 from the image data library 44 and comparing the actual image of each component P visually recognized by the inspection camera 32 with the image data 45 corresponding to the type of the component P read out from the image data library 44.

A data receiving unit 46 (FIG. 4) of the post-mounting inspection device 5 receives the substitute component related data when the substitute component related data transmitted from the component mounting device 4 is present and stores the received data in the receiving data storage unit 47 (FIG. 4), but when the inspection for one substrate PB ends and the next substrate PB is carried in, the inspection control unit 41 accesses the receiving data storage unit 47 to read out the substitute component related data when the substitute component related data stored in the storage unit is present. Further, based on the read-out substitute component related data, the substrate PB on which the substitute components are mounted and the mounting positions at which the mounting components on the substrate PB are mounted are specified and the image data of the component P at the mounting position at which the substitute components are mounted is changed to the image data corresponding to the type of the substitute components.

That is, in the exemplary embodiment of the invention, the inspection control unit 41, the storage unit 42, and the code reader 38 become a "data change unit" that specifies the substrate PB on which the substitute components are mounted and the mounting positions at which the substitute components on the substrate PB are mounted and changes the image data (inspection data) of the component P at the mounting position at which the substitute components are mounted to the image data corresponding to the type of the substitute components, based on the substitute component related data received by the data receiving unit 46.

In this case, the inspection control unit 41 uses the individual identification code C read by the code reader 38 so as to specify the substrate PB on which the substitute components are mounted, similar to the case of the component mounting device 4.

While the component mounting device 4 performs the component mounting process on another substrate PB, when the component to be supplied is switched from "component a" to "component b" that is the substitute component, a position at which "component a" was to be mounted on the substrate PB is mounted with "component a" as well as "component b", such that "component a" and "component b" are mixed on one substrate PB, but the information on the substrate PB on which "component b" is mounted and the mounting position at which the "component b" is mounted on the substrate PB is transmitted to the post-mounting inspection device 5 as the substitute component related data, the post-mounting inspection device 5 specifies the substrate PB on which "component b" is mounted and the mounting position at which the "component b" is mounted on the substrate PB based on the transmitted substitute component related data and changes the image data (inspection data) of the components P at the specified mounting positions to the image data corresponding to the type of the substitute components, such that the post-mounting inspection device 5 executes the inspection corresponding to the substitute components without causing the operator to perform any input operation in the post-mounting inspection device 5, thereby preventing the inspection errors from occurring. The inspection control unit 41 of the post-mounting inspection device 5 operates the substrate transportation path 11 when the inspection for the substrate PB ends and carries the substrate PB out to the reflow furnace 6 at the downstream side.

Next, a sequence of the component mounting process performed by the component mounting device 4 configuring the component mounting line 1 and a sequence of the substrate inspection process performed by the post-mounting inspection device 5 will be described with reference to FIGS. 7 and 8.

In FIG. 7, when the input of the substrate PB to the substrate transportation path 11 from the post-printing inspection device 3 is detected by the detector (not shown), the mounting control unit 21 of the component mounting device 4 operates the substrate transportation path 11 to carry in the substrate PB and position the substrate PB in the predetermined working position (step ST1). Further, the individual identification code C of the substrate PB that is carried in and positioned is read by the code reader 18 (step ST2). In addition, at the time of positioning the substrate PB, the mounting head 12 is moved to be above the substrate PB, a substrate position detection mark on the substrate PB is imaged by the substrate camera 16 and the position mismatch from the reference position of the substrate PB is obtained.

When the individual identification code C of the substrate PB is read by the code reader 18, the mounting control unit 21 reads the mounting positions of the component P on the substrate PB which is the mounted object from the NC program 23 (step ST3). Further, it is determined whether the mounted components P are the substitute components based on the input information from the input unit 26 and the information from the component supply state detector 28 (step ST4). For example, if the contents that 'in regards of the tape feeder supplying "component a" from the input unit 26, when the head part of the tape is detected, "component a" of the NC program 23 is replaced with "component b"' are input from the input unit 26 and the head part of the tape is detected by the component supply state detector 28, it is determined that the mounted component P and the subsequently component P are the substitute components.

When it is determined that the mounted components P are not the substitute components in step ST4, the mounting control unit 21 reads out the component parameters 25 corresponding to the type of the components P from the component library 24 (step ST5). In addition, the mounting of the components P to the substrate PB is performed based on the read-out component parameters 25 (step S6). The mounting of the components P to the substrate PB is performed in sequence of (1) picking up the components P supplied to the component supply position 15a by moving the mounting head 12 above the tape feeder 15, (2) imaging the components P by passing the picked up components P above the component camera 17 and performing the component recognition of the components P, thereby obtaining the position mismatch (adsorption mismatch) of the components P with regard to the adsorption nozzle 12a, (3) moving the picked up components P immediately above the mounting positions on the substrate PB, and (4) separating the components P from the substrate PB while performing the horizontal in-plane directional movement and the rotating operation of the adsorption nozzle 12a so as to correct the position mismatch of the substrate PB and the adsorption mismatch of the component P, thereby mounting the components P at the mounting positions.

On the other hand, when it is determined that the mounted components P are the substitute components in step ST4, the mounting control unit 21 performs the rewriting of the name of the type of the components P in the NC program 23 (step ST7). In the above example, "component a" of the NC program 23 is rewritten to "component b".

When the rewriting of the name of the type of the components P ends, the mounting control unit 21 creates the substitute component related data including the individual identification code C of the current substrate PB read in step ST2, the mounting positions of the mounted substitute components, and the surface of the type of the substitute components and stores the substitute component related data in the transmission data storage unit 27 (step ST8).

When the substitute component related data are created and the created substitute component related data are stored in the transmission data storage unit 27 in step ST8, the mounting control unit 21 reads out the component parameters 25 corresponding to the type of the mounted components P (substitute components) from the component library 24 (step ST5) and performs the mounting of the components P to the substrate PB based on the read out component parameters 25 (step ST6).

When the component mounting ends in step ST6, the mounting control unit 21 determines whether the component mounting to one substrate PB using the component mounting has ended (step ST9). As a result, when the component mounting to one substrate PB has not ended, the process returns to step ST3 and the mounting positions on the substrate PB of the subsequently mounted component P are read out from the NC program 23. On the other hand, when the component mounting to one substrate PB has ended, it is determined whether the substitute components were used in the substrate PB (step ST10). Further, when the substitute components were not used, the substrate PB is carried out to the post-mounting inspection device 5 at the downstream side by operating the substrate transportation path 11 (step ST11)

and when the substitute components were used, the data stored in the transmission data storage unit 27 in step ST8 are transmitted to the post-mounting inspection device 5 (step ST12) and then the substrate PB is carried out to the post-mounting inspection device 5 (step ST11).

When the carrying out of the substrate PB is performed in step ST11, the mounting control unit 21 determines whether or not the component mounting for the all scheduled substrates PB by the carrying out of the substrate PB has ended (step ST13). As a result, when the component mounting for the all substrates PB has not ended, the process returns to step ST11 to perform the carrying in and the positioning of the subsequent substrate PB and when the component mounting for the all substrates PB has ended, the series of the component mounting processes ends.

Next, the inspection process of the substrate PB using the post-mounting inspection device 5 will be described. In FIG. 8, when it is detected by the detector (not shown) that the substrate PB is input from the component mounting device 4 at the upstream to the substrate transportation path 11, the inspection control unit 41 of the control device (inspection device control device 40) included in the post-mounting inspection device 5 operates the substrate transportation path 11 to carry in the substrate PB and perform the positioning at the predetermined working position (step ST21). Further, the individual identification code C that is carried in and positioned is read by the code reader 38 (step ST22).

When the individual identification code C of the substrate PB is read by the code reader 38, the inspection control unit 41 references the component mounting data 43 and the image data library 44 and the image data 45 corresponding to the type is made to correspond to each component P mounted on the substrate PB (step ST23).

When the image data 45 corresponding to the type corresponds to each component P on the substrate PB, the inspection control unit 41 determines whether or not the substitute component related data is received from the component mounting device 4 (step ST24). As a result, when the substitute component related data have not been received from the component mounting device 4, the inspection is executed by the corresponding image data 45 in step ST23 (step ST25). As described above, the inspection is executed by comparing the actual image of each component P obtained by the visualization with the image data 45 corresponding to the type of the component P and determining whether or not the mounting state of each component P on the substrate PB is good while visualizing the local appearance of the substrate PB in a predetermined order by operating each part of the post-mounting inspection device 5 in accordance with the component mounting data 43.

On the other hand, when the substitute component related data have been received from the component mounting device 4, the inspection is executed after specifying the substrate PB on which the substitute components are mounted and the mounting positions at which the substitute components on the substrate PB are mounted and changing the image data (inspection data) of the component P at the mounting positions at which the substitute components are mounted from the corresponding image data in step ST23 to the image data corresponding to the type of the substitute components, based on the received (that is, transmitted from the component mounting device 4) substitute component related data (step ST25 and step ST26).

When the inspection for one substrate PB in step ST25 ends, the inspection control unit 41 operates the substrate transportation path 11 to carry out the substrate PB to the outside (step ST27).

When the substrate PB is carried out to the outside in step ST27, the inspection control unit 41 determines whether or not the inspection for the all scheduled substrate PB by the carrying out of the substrate PB has ended (step ST28). As a result, when the inspection for all substrate PB has not ended, the process returns to the step 21 and the carrying in and the positioning of the subsequent substrate PB is performed and when the inspection for all substrate PB has ended, the series of the inspection processes for the substrate PB ends.

As described above, the component mounting line 1 according to the exemplary embodiment of the invention includes the component mounting device 4 which mounts the components P on the substrate PB, and the post-mounting inspection device 5 serving as the inspection device which performs the appearance visual inspection of the substrate PB on which the components P are mounted by the component mounting device 4. The component mounting device 4 includes a data creation unit (the mounting control unit 21, the input unit 26, the code reader 18, and the component supply state detector 28) for, when the substitute components which are another type of components having the same electrical characteristics and a different appearance are mounted in place of one type of components at the mounting positions on the substrate, creating substitute component related data including information specifying the substrate PB on which substitute components are mounted and the mounting positions at which the substitute components on the substrate PB are mounted and information indicating the types of substitute components, and data transmission unit (the data transmitter 29) for transmitting the substitute component related data created by the data creation unit to the post-mounting inspection device 5. The post-mounting inspection device 5 includes a data receiving unit (the data receiver 46) for receiving the substitute component related data transmitted from the component mounting device 4, and a data change unit (the inspection control unit 41, the storage unit 42, and the code reader 38) for specifying the substrate PB on which the substitute components are mounted and the mounting positions at which the substitute components on the substrate PB are mounted on the basis of the substitute components related data received from the data receiving unit and changing data (image data 45) for inspecting the components P at the mounting positions at which the substitute components are mounted to data corresponding to the types of the substitute components.

The component mounting method according to the exemplary embodiment of the invention is the component mounting method using the component mounting line 1. The component mounting line 1 includes the component mounting device 4 which mounts the components P on the substrate PB, and the post-mounting inspection device 5 which performs appearance visual inspection for the substrate PB with the components P mounted by the component mounting device 4. The component mounting method includes the steps of, when the substitute components are mounted in place of one type of components P, at the mounting positions on the substrate PB (Step ST8 and Step ST12), causing the component mounting device 4 to create substitute component related data including information specifying the substrate PB on which substitute components are mounted and the mounting positions at which the substitute components on the substrate PB are mounted and information indicating the types of substitute components and to transmit the substitute component related data to the post-mounting inspection device, and causing the post-mounting inspection device 5 to specify the substrate PB on which the substitute components are mounted and the mounting positions at which the substitute components on the substrate PB are mounted on the basis of the substitute components related data received from the component mounting device 4 and to change data (image data 45) for inspecting the components P at the mounting positions at which the substitute components are mounted to data corresponding to the types of the substitute components (Step ST26).

In the component mounting line 1 or the component mounting method according to another exemplary embodiment of the invention, when the substitute components are mounted in place of one type of components P, at the mounting positions on the substrate PB, the component mounting device 4 creates substitute component related data including information specifying the substrate PB on which substitute components are mounted and the mounting positions at which the substitute components on the substrate PB are mounted and information indicating the types of substitute components and transmits the substitute component related data to the post-mounting inspection device 5. The post-mounting inspection device 5 specifies the substrate PB on which the substitute components are mounted and the mounting positions at which the substitute components on the substrate PB are mounted on the basis of the substitute components related data received from the component mounting device 4 and changes data (image data 45) for inspecting the components P at the mounting positions at which the substitute components are mounted to data corresponding to the types of the substitute components. Therefore, even when the substitute components are used in the component mounting device, it is possible to improve the working efficiency as it is not necessary for the operator to perform an input operation in the post-mounting inspection device 5.

In the component mounting line 1 according to the exemplary embodiment of the invention, the data creation unit and the data change unit respectively include the code readers 18 and 38 serving as the code reading unit which read the individual identification code C provided on the substrate PB. The data creation unit specifies the substrate PB on which the substitute components are mounted on the basis of the individual identification code C of the substrate PB read by the code reader 18, and the data change unit specifies the substrate PB on which the substitute components are mounted on the basis of the individual identification code C of the substrate PB read by the code reader 38. Therefore, it is possible to reliably specify the substrate PB on which the substitute components are mounted with a simple configuration.

Although the exemplary embodiments of the invention have been described up until now, the invention is not limited to that described in the above-described exemplary embodiments. For example, a combination of a working machine and the component mounting line described in the above-described exemplary embodiments is just an example. An arbitrary combination of a working machine may be made insofar as the working machine includes the component mounting device which mounts the components on the substrate, and the inspection device which performs the appearance visual inspection of the substrate on which the components are mounted.

Although the invention has been described in detail in connection with the exemplary embodiments, it is apparent to those skilled in the art that various changes and modifications can be made without departing from the spirit and scope of the invention.

The subject application is based on Japanese Patent Application No. 2009-012620, filed on Jan. 23, 2009, the content of which is incorporated herein by reference.

INDUSTRIAL APPLICABILITY

The invention provides the component mounting line and the component mounting method where it is not necessary for the operator to perform an input operation in the inspection device when the substitute components are used in the component mounting device.

REFERENCE SIGNS LIST

1: COMPONENT MOUNTING LINE
4: COMPONENT MOUNTING DEVICE
5: POST-MOUNTING INSPECTION DEVICE (INSPECTION DEVICE)
18: CODE READER (DATA CREATION UNIT, CODE READING UNIT)
21: MOUNTING CONTROL UNIT (DATA CREATION UNIT)
26: INPUT UNIT (DATA CREATION UNIT)
28: COMPONENT SUPPLY STATE DETECTOR (DATA CREATION UNIT)
29: DATA TRANSMISSION UNIT (DATA TRANSMISSION UNIT)
38: CODE READER (DATA CHANGE UNIT, CODE READING UNIT)
41: INSPECTION CONTROL UNIT (DATA CHANGE UNIT)
42: STORAGE UNIT (DATA CHANGE UNIT)
45: IMAGE DATA (INSPECTION DATA)
46: DATA RECEIVING UNIT (DATA RECEIVING UNIT)
PB: SUBSTRATE
C: INDIVIDUAL IDENTIFICATION CODE
P: COMPONENT

The invention claimed is:

1. A component mounting line comprising:
a component mounting device which mounts components on a substrate; and
an inspection device which performs appearance visual inspection for a substrate with components mounted by a component mounting device,
wherein the component mounting device includes a data creation unit for, when substitute components which are another type of components having the same electrical characteristics and a different appearance are mounted in place of one type of components at the mounting positions on the substrate, creating substitute component related data including information specifying the substrate on which substitute components are mounted and the mounting positions at which the substitute components on the substrate are mounted and information indicating types of substitute components, and a data transmission unit for transmitting the substitute component related data created by the data creation unit to the inspection device, and
the inspection device includes a data receiving unit for receiving the substitute component related data transmitted from the component mounting device, and a data change unit for specifying the substrate on which the substitute components are mounted and the mounting positions at which the substitute components on the substrate are mounted on the basis of the substitute components related data received from the data receiving unit, and changing data for inspecting the components at the mounting positions at which the substitute components are mounted to data corresponding to the types of the substitute components.

2. The component mounting line according to claim 1, wherein each of the data creation unit and the data change unit includes a code reading unit for reading an individual identification code provided on the substrate, the data creation unit specifies the substrate on which the substitute components are mounted on the basis of the individual identification code of the substrate read by the code reading unit, and the data change unit specifies the substrate on which the substitute components are mounted on the basis of the individual identification code of the substrate read by the code reading unit.

3. A component mounting method using a component mounting line wherein the component mounting line includes a component mounting device which mounts components on a substrate, and an inspection device which performs appearance visual inspection for the substrate with components mounted by the component mounting device, the component mounting method comprising the steps of:

creating substitute component related data including information specifying the substrate on which substitute components are mounted and the mounting positions at which the substitute components on the substrate are mounted and information indicating types of substitute components and transmitting the substitute component related data to the inspection device, by means of by the component mounting device, when substitute components, another type of components that have the same electrical characteristics and a different appearance are mounted in place of one type of components at the mounting positions on the substrate; and specifying the substrate on which the substitute components are mounted and the mounting positions at which the substitute components on the substrate are mounted on the basis of the substitute components related data received from the component mounting device and to change data for inspecting the components at the mounting positions at which the substitute components are mounted to data corresponding to the types of the substitute components.

4. The component mounting line according to claim 1, wherein the substitute component related data include information specifying an individual identification code of the substrate on which the substitute components are mounted and the mounting positions at which the substitute components on the substrate are mounted and information indicating names of the types of the substitute components.

5. The component mounting method according to claim 3, wherein the substitute component related data include information specifying an individual identification code of the substrate on which the substitute components are mounted and the mounting positions at which the substitute components on the substrate are mounted and information indicating names of the types of the substitute components.

* * * * *